(12) United States Patent
Briggs (10) Patent No.: US 8,564,214 B2
(45) Date of Patent: Oct. 22, 2013

(54) CIRCUITS FOR SENSING CURRENT LEVELS WITHIN LIGHTING APPARATUS

(75) Inventor: Gerald Edward Briggs, Ottawa (CA)

(73) Assignee: Arkalumen Inc., Ottawa (CA)

( * ) Notice: Subject to any disclaimer, the term of this patent is extended or adjusted under 35 U.S.C. 154(b) by 265 days.

(21) Appl. No.: 13/104,919

(22) Filed: May 10, 2011

(65) Prior Publication Data

US 2011/0279048 A1   Nov. 17, 2011

Related U.S. Application Data

(60) Provisional application No. 61/333,746, filed on May 11, 2010.

(51) Int. Cl.
*H05B 37/02* (2006.01)
(52) U.S. Cl.
USPC ..................................... 315/209 R; 315/193
(58) Field of Classification Search
USPC .......... 315/209 R, 193, 185 R, 291, 295, 297, 315/299, 302
See application file for complete search history.

(56) References Cited

U.S. PATENT DOCUMENTS

| | | | |
|---|---|---|---|
| 4,593,234 A | 6/1986 | Yang | |
| 5,006,782 A | 4/1991 | Pelly | |
| 5,237,264 A | 8/1993 | Moseley et al. | |
| 5,248,919 A | 9/1993 | Hanna et al. | |
| 5,783,909 A | 7/1998 | Hochstein | |
| 5,803,579 A | 9/1998 | Turnbull et al. | |
| 5,932,995 A | 8/1999 | Wagoner | |
| 5,949,539 A | 9/1999 | Britton, Jr. et al. | |
| 6,175,195 B1 | 1/2001 | Janczak et al. | |
| 6,198,230 B1 | 3/2001 | Leeb et al. | |
| 6,222,352 B1 | 4/2001 | Lenk | |
| 6,351,079 B1 | 2/2002 | Willis | |
| 6,400,482 B1 | 6/2002 | Lupton et al. | |
| 6,426,599 B1 | 7/2002 | Leeb | |
| 6,504,633 B1 | 1/2003 | Hovorka et al. | |
| 6,548,967 B1 | 4/2003 | Dowling et al. | |
| 6,596,977 B2 | 7/2003 | Muthu et al. | |
| 6,621,235 B2 | 9/2003 | Chang | |
| 6,794,831 B2 | 9/2004 | Leeb et al. | |
| 6,853,150 B2 | 2/2005 | Clauberg et al. | |
| 6,954,591 B2 | 10/2005 | Lupton et al. | |
| 7,016,115 B1 | 3/2006 | Leeb et al. | |
| 7,141,779 B1 | 11/2006 | Chew et al. | |
| 7,321,203 B2 | 1/2008 | Marosek | |
| 7,457,089 B2 * | 11/2008 | Ohshima | 361/86 |
| 7,486,032 B2 | 2/2009 | Lee | |
| 7,495,425 B2 | 2/2009 | Friedrich | |
| 7,498,754 B2 | 3/2009 | Masood | |
| 7,511,463 B2 | 3/2009 | Kumar | |

(Continued)

*Primary Examiner* — Daniel D Chang
(74) *Attorney, Agent, or Firm* — Sean Murray; Murray IP Consulting Inc.

(57) ABSTRACT

Circuits for sensing current levels within an apparatus are disclosed. In specific cases, a constant voltage power supply is used to power an LED lighting apparatus in which there are uncertainties within the forward voltages of the LEDs, which in turn creates uncertainty with respect to the current level flowing through the LEDs. To manage these uncertainties, the current flowing through the LEDs is measured by determining a voltage level across a known resistor and calculating the current level. To prevent the known resistor from causing a significant reduction in the efficiency of the overall light engine, the circuit includes one or more transistors in parallel with the known resistor to reduce the effective resistance in the LED circuit during times that the current is not being sensed.

18 Claims, 8 Drawing Sheets

(56) References Cited

U.S. PATENT DOCUMENTS

| | | |
|---|---|---|
| 7,649,326 B2 | 1/2010 | Johnson et al. |
| 7,683,504 B2 | 3/2010 | Blair et al. |
| 7,750,616 B2 | 7/2010 | Liu |
| 7,759,881 B1 | 7/2010 | Melanson |
| 8,358,085 B2 | 1/2013 | Catalano et al. |
| 2004/0263093 A1 | 12/2004 | Matsubayashi et al. |
| 2005/0127888 A1 | 6/2005 | Marschalkowski et al. |
| 2005/0225264 A1 | 10/2005 | Kemp |
| 2005/0269580 A1 | 12/2005 | D'Angelo |
| 2006/0113975 A1 | 6/2006 | Mednik et al. |
| 2006/0239689 A1 | 10/2006 | Ashdown |
| 2007/0103086 A1 | 5/2007 | Neudorf et al. |
| 2007/0103832 A1* | 5/2007 | Ohshima ............... 361/93.1 |
| 2007/0159421 A1 | 7/2007 | Peker et al. |
| 2007/0182338 A1 | 8/2007 | Shteynberg et al. |
| 2007/0195552 A1 | 8/2007 | Park |
| 2007/0229047 A1 | 10/2007 | Sigamani et al. |
| 2007/0268028 A1* | 11/2007 | Moyer et al. ............... 324/713 |
| 2007/0278974 A1 | 12/2007 | Van De Ven |
| 2008/0079705 A1 | 4/2008 | Yang et al. |
| 2008/0138085 A1 | 6/2008 | Lin et al. |
| 2008/0150449 A1 | 6/2008 | Wang et al. |
| 2008/0191642 A1 | 8/2008 | Slot et al. |
| 2008/0224636 A1 | 9/2008 | Melanson |
| 2008/0252664 A1 | 10/2008 | Huang et al. |
| 2009/0096392 A1 | 4/2009 | Chandran et al. |
| 2009/0134817 A1 | 5/2009 | Jurngwirth et al. |
| 2009/0174337 A1 | 7/2009 | Miskin et al. |
| 2009/0251059 A1 | 10/2009 | Veltman |
| 2009/0251071 A1 | 10/2009 | Gater et al. |
| 2009/0322252 A1 | 12/2009 | Shiu et al. |
| 2010/0033146 A1 | 2/2010 | Irissou et al. |
| 2010/0060187 A1 | 3/2010 | Newman et al. |
| 2010/0066266 A1 | 3/2010 | Huang et al. |
| 2010/0072899 A1 | 3/2010 | Engstrand |
| 2010/0079124 A1 | 4/2010 | Melanson |
| 2010/0102230 A1 | 4/2010 | Chang et al. |
| 2010/0164406 A1 | 7/2010 | Kost et al. |
| 2010/0171429 A1 | 7/2010 | Garcia et al. |
| 2010/0171442 A1 | 7/2010 | Draper et al. |
| 2010/0277075 A1 | 11/2010 | Rees |
| 2010/0289424 A1 | 11/2010 | Chang et al. |
| 2010/0320936 A1 | 12/2010 | Yao |
| 2010/0320939 A1 | 12/2010 | Lai |
| 2011/0006691 A1 | 1/2011 | Blaha et al. |
| 2011/0050130 A1 | 3/2011 | Rudolph |
| 2011/0115394 A1 | 5/2011 | Shteynberg et al. |
| 2011/0115412 A1 | 5/2011 | Welten |
| 2011/0298386 A1* | 12/2011 | Corradi ............... 315/224 |

\* cited by examiner

CIRCUITS FOR SENSING CURRENT LEVELS WITHIN LIGHTING APPARATUS

CROSS-REFERENCE TO RELATED APPLICATION

The present application claims the benefit under 35 USC 119(e) of U.S. Provisional Patent Application 61/333,746 filed on May 11, 2010 and hereby incorporated by reference herein.

FIELD OF THE INVENTION

The invention relates generally to lighting apparatus and, more particularly, to circuits for sensing current levels within lighting apparatus.

BACKGROUND

Light Emitting Diodes (LEDs) are increasingly being adopted as general illumination lighting sources due to their high energy efficiency and long service life relative to traditional sources of light such as incandescent, fluorescent and halogen. Each generation of LEDs are providing improvements in energy efficiency and cost per lumen, thus allowing for lighting manufacturers to produce LED light fixtures at increasingly cost competitive prices.

While the component LEDs are increasing in energy efficiency, there are considerable other components within an LED light fixture that cause drains on the overall lumens per Watt achievable within the overall system. For instance, inefficiencies within the optics used and the AC/DC power supply both reduce the overall energy efficiency for the light fixture. Further, operating the LEDs at non-optimal current (amperage) levels can reduce the energy efficiency of the LEDs and therefore the overall light fixture. In fact, if the current flowing through the LEDs exceeds a maximum allowable level, the LEDs may be damaged or permanently burnt out, and thus require replacement.

One issue that arises when managing the current flow through the LEDs is that LEDs are not constant in terms of their forward voltages (voltage drops), or other characteristics such as color/color temperature and brightness. Each LED that is manufactured is generally categorized based on a number of criteria including their forward voltage, this categorization being based on bin codes and therefore called "binning" In manufacturing light fixtures with LEDs, the developer will generally want a consistent light output from each of its "identical" light fixtures. To do this, the manufacturer will select the binning of its LEDs to be consistent. A problem that arises is that the more narrow the binning criteria provided by the developer, the higher prices that are typically charged for the LEDs. On the other hand, it becomes difficult to design a circuit for the LEDs if the uncertainty related to the forward voltages of the LEDs is significant.

In some architectures, the LED light fixtures are powered with a constant current power supply that can be locked to a particular current through a feedback control system using an inductor. In this architecture, the control system can manage differences in forward voltages within the LEDs within a predefined limit.

In other architectures, a constant voltage power supply is used and the current to flow through the LEDs is controlled by the voltage output from the voltage power supply and the impedances within the circuit. In this case, differences in forward voltages across LEDs within different light fixtures can make a significant difference in the current flowing through the LEDs. Further, the voltage output from the constant voltage power supply may be adjustable and adjustments in the voltage supply can further change the current flowing through the LEDs.

Against this background, there is a need for solutions that will mitigate at least one of the above problems and, in particular, to enable monitoring and/or control of the current flowing through the LEDs while not materially decreasing the efficiency of the system.

SUMMARY OF THE INVENTION

According to a first broad aspect, the invention seeks to provide a circuit comprising at least one component and a current sense circuit. The at least one component is coupled between a supply voltage and a node while the current sense circuit is coupled between the node and a reference ground. The current sense circuit comprises a resistor coupled in parallel with at least one transistor, the at least one transistor being activated during a first state and being deactivated during a second state. The node is coupled to a current determination apparatus operable to determine a current flowing through the at least one component during the second state using a voltage sensed at the node.

In some embodiments, the at least one component comprises at least one light emitting diode (LED) and a light control transistor coupled in series with the at least one LED. The light control transistor is activated for a time period set for the at least one LED to be activated within a duty cycle. The at least one transistor within the current sense circuit is within the second state during the time period set for the at least one LED to be activated within the duty cycle. Further, in embodiments of the present invention a resistance of the current sense circuit is at a first value during the first state and a second value higher than the first value during the second state.

According to a second broad aspect, the invention seeks to provide an apparatus incorporating a circuit according to the first broad aspect. The apparatus further comprises the current determination apparatus. In some embodiments, in order to determine a current flowing through the at least one component during the second state, the current determination apparatus is operable to sense a voltage at the node during the second state and to divide the sensed voltage by a resistance of the resistor within the current sense circuit. In some embodiments, the current determination apparatus is further operable to determine a current flowing through the at least one component during the first state by compensating the determined current flowing through the at least one component during the second state by the change in resistance within the current sense circuit between the first and second states.

According to a third broad aspect, the invention seeks to provide a circuit comprising at least one component and a current sense circuit. The at least one component is coupled between a node and a reference ground while the current sense circuit is coupled between a supply voltage and the node. The current sense circuit comprises a resistor coupled in parallel with at least one transistor, the at least one transistor being activated during a first state and being deactivated during a second state. The node is coupled to a current determination apparatus operable to determine a current flowing through the at least one component during the second state using a voltage sensed at the node.

These and other aspects of the invention will become apparent to those of ordinary skill in the art upon review of the following description of certain embodiments of the invention in conjunction with the accompanying drawings.

BRIEF DESCRIPTION OF THE DRAWINGS

A detailed description of embodiments of the invention is provided herein below, by way of example only, with reference to the accompanying drawings, in which.

It is to be expressly understood that the description and drawings are only for the purpose of illustration of certain embodiments of the invention and are an aid for understanding. They are not intended to be a definition of the limits of the invention.

DETAILED DESCRIPTION OF EMBODIMENTS

The present invention is directed to circuits for sensing current levels within apparatus. In embodiments of the present invention, a constant voltage power supply is used to power an LED lighting apparatus in which there are uncertainties within the forward voltages of the LEDs, which in turn creates uncertainty with respect to the current level flowing through the LEDs. To manage these uncertainties, the current flowing through the LEDs is measured by determining a voltage level across a known resistor and calculating the current level. To prevent the known resistor from causing a significant reduction in the efficiency of the overall light engine, the circuit includes one or more transistors in parallel with the known resistor to reduce the effective resistance in the LED circuit during times that the current is not being sensed.

Figure 1:
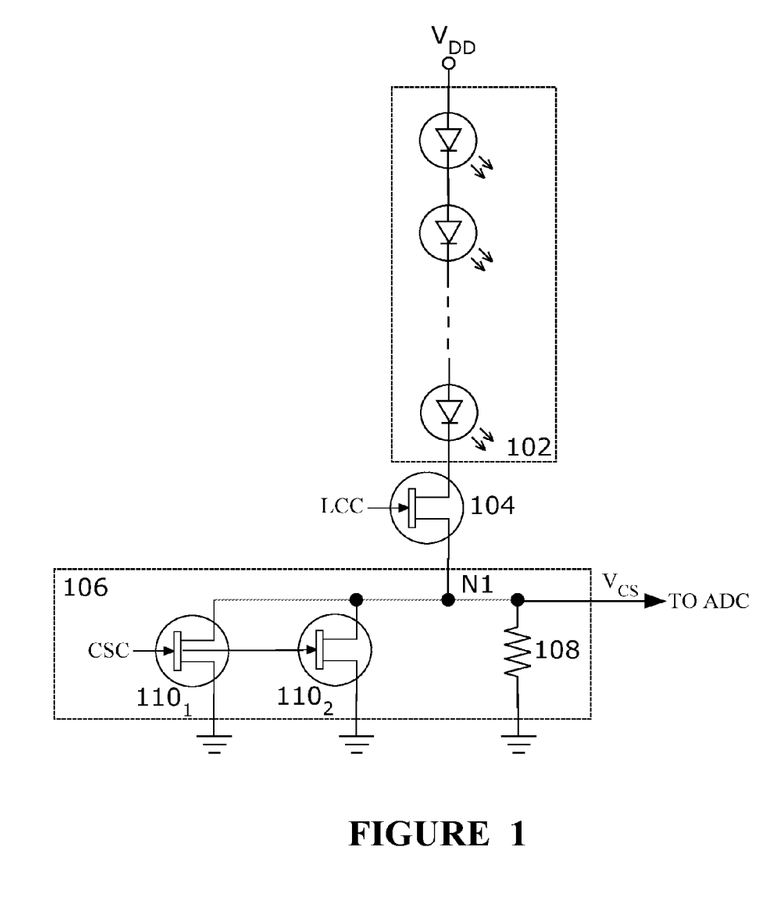
FIG. 1 is an electrical circuit diagram of a light engine according to one embodiment of the present invention.

FIG. 1 is an electrical circuit diagram of a light engine according to one embodiment of the present invention. As shown, the circuit of FIG. 1 comprises a plurality of LEDs 102 coupled in series with a channel control transistor 104 and a current sense circuit 106 between a supply voltage $V_{DD}$ and a reference ground. The current sense circuit 106 comprises a current sense resistor 108 with a resistance $R_A$ coupled in parallel with two current sense control transistors $110_1, 110_2$ between the channel control transistor 104 and the reference ground.

The channel control transistor 104 is controlled by a Light Channel Control (LCC) signal at its gate/base which dictates when current flows through the LEDs. The LCC signal would generally be a Pulse Width Modulation (PWM) signal that is high and low for periods of time within a duty cycle. The ratio of the time that the LCC signal is high relative to the time that the LCC signal is low dictates the level of light output that would be visible from the LEDs. In particular, if the LCC signal is fully high, the LEDs will be "on" at all times and therefore will project lumens of light 100% of the time. On the other hand, if the LCC signal is 50% high and 50% low, the LEDs will be "on" half the time and therefore the LEDs will dimmed by 50% from the full "on" state. It should be understood that other levels of dimming could be performed by controlling the LCC signal. In some embodiments, the channel control transistor 104 could be removed. In this case, the LEDs 102 would be directly coupled to the current sense circuit 106 and would be always on when the supply voltage is applied.

According to embodiments of the present invention, there are instances that may require a determination of the current flowing through the LEDs 102. The current sense circuit 106 as shown in FIG. 1 is designed to allow for a current sense voltage $V_{CS}$ to be sensed while not substantially decreasing the efficiency of the overall circuit during a substantial portion of the duty cycle of operation. As shown in FIG. 1, the current sense voltage $V_{CS}$ is being sensed at a node N1 coupled between the channel control transistor 104 and the current sense circuit 106. It should be understood that other nodes within the circuit of FIG. 1 could be used to provide a sensed voltage and node N1 is utilized for simplicity. The current sense voltage $V_{CS}$ will be equal to the resistance $R_{CS}$ of the current sense circuit 106 multiplied by the current flowing through the circuit 106. Therefore, with knowledge of the resistance $R_{CS}$ of the current sense circuit and measuring the current sense voltage $V_{CS}$, the current flowing through the circuit 106, and therefore also the current flowing through the LEDs 102, can be calculated.

The current sense voltage $V_{CS}$ is detected at an Analog to Digital Convertor (ADC) (not shown) or another circuit which may be used to create an indication of the voltage $V_{CS}$ on node N1. To provide an accurate detection of the current sense voltage $V_{CS}$, it is desired that the signal to noise ratio of the voltage be relatively high. If the resistance $R_{CS}$ across the current sense circuit 106 is substantially low, the voltage $V_{CS}$ will also be low and potentially difficult to accurately detect relative to noise within the circuit. Therefore, to provide an accurate detection of the current sense voltage $V_{CS}$, it is desirable to have a relatively substantial resistance $R_{CS}$ across the current sense circuit 106. On the other hand, the resistance $R_{CS}$ across the current sense circuit 106 is a source of power loss and, the higher that the resistance $R_{CS}$ is and therefore the higher the accuracy of the voltage measurement, the lower the energy efficiency of the overall circuit of FIG. 1. To deal with this issue, the current sense circuit 106, according to embodiments of the present invention, utilizes the current sense control transistors $110_1, 110_2$ to adjust the resistance $R_{CS}$ across the current sense circuit 106.

The current sense control transistors $110_1, 110_2$ are controlled by a Current Sense Control (CSC) signal at their gates/bases that dictates the resistance across the current sense circuit 106. When the CSC signal is low, the transistors $110_1, 110_2$ are off and the resistance $R_{CS}$ across the current sense circuit 106 is equal to the resistance $R_A$ of the current sense resistor 108. When the CSC signal is high, the transistors $110_1, 110_2$ are on and the resistance $R_{CS}$ across the current sense circuit 106 is:

$$R_{CS} = \frac{1}{\frac{1}{R_1} + \frac{1}{R_2} + \frac{1}{R_A}}$$

where $R_1$ and $R_2$ are the resistances of the drain-source or collector-emitter paths of the transistors $110_1, 110_2$ respectively when turned on. $R_1$ and $R_2$ are also known as the "on resistance" for the transistors $110_1, 110_2$ respectively.

In one particular example implementation, the resistance $R_4$ of resistor 108 may be 0.25Ω while the resistances $R_1, R_2$ may each be 0.025Ω. In this case, the resistance $R_{CS}$ across the current sense circuit 106 when the transistors $110_1, 110_2$ are off would be 0.25Ω while the resistance $R_{CS}$ across the current sense circuit 106 when the transistors $110_1, 110_2$ are on would be ~0.012Ω. In this example, if the current flowing through the current sense circuit 106 is 4.0 A, the power loss when the transistors $110_1, 110_2$ are off would be ~4.0 W while the power loss when the transistors $110_1, 110_2$ are on would be ~0.19 W. This difference in power loss can have a significant difference in the overall energy efficiency of the circuit of FIG. 1.

By normally having the current sense control transistors $110_1, 110_2$ on and only turning the transistors $110_1, 110_2$ off during a limited time for a current sense operation, the overall power loss from the current sense circuit 106 can be minimized In one implementation, the duty cycle for the circuit of FIG. 1 may be divided into 256 slots. In this case, the intensity of the light output from the circuit can be controlled by adjusting the number of slots in which the LCC signal is high and therefore adjusting the amount of time within the duty cycle that the LEDs 102 are turned on. The time in which the resistance $R_{CS}$ across the current sense circuit 106 is high, and therefore the current sense voltage $V_{CS}$ is desirable for detection, can be controlled by adjusting the number of slots in which the CSC signal is low while the LCC signal is high (since the channel control transistor 104 must be turned on to sense the current flowing through the LEDs 102). For instance, if the CSC signal is low for a single slot of 256 slots, the current sense voltage $V_{CS}$ will be desirable for detection by the ADC during that slot (as long as the LCC signal is high for that slot).

To ensure that the current sense voltage $V_{CS}$ is in equilibrium and not in a transitional state caused by the turning off of the transistors $110_1, 110_2$, in some embodiments, the current sense voltage $V_{CS}$ is measured by the ADC at a later portion of the time that the CSC signal is low. For instance, if a duty cycle is divided into 256 slots and the duty cycle is 1 ms, each slot would comprise ~3.9 μs. In this case, the detection of the current sense voltage $V_{CS}$ may take place 2-3 μs after the transistors $110_1, 110_2$ are turned off. Further, in some embodiments, the measuring of the current sense voltage $V_{CS}$ is performed in a plurality of duty cycles and the overall value is determined by averaging the values detected during the individual duty cycles.

Figure 3:
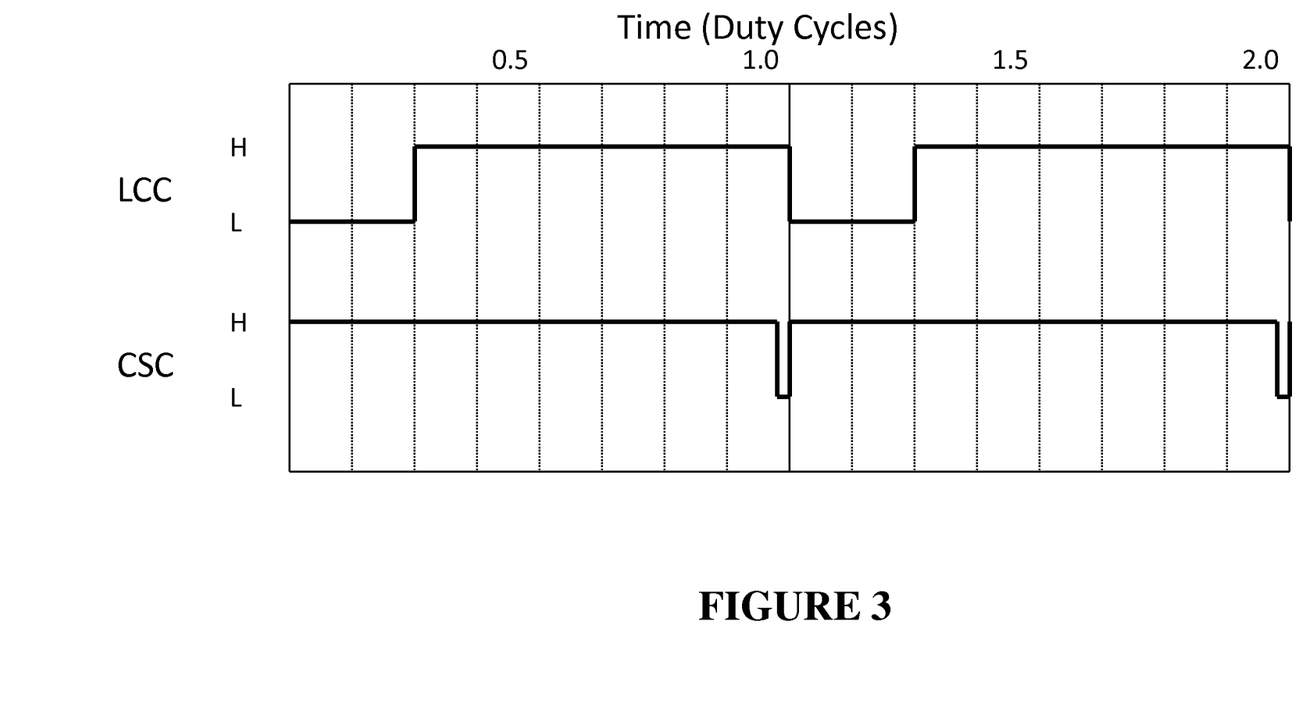
FIG. 3 is a signal flow diagram for a sample duty cycle for a light channel control (LCC) and current sense control (CSC) signals according to a particular example implementation of the present invention.

FIG. 3 depicts a signal flow diagram for a sample duty cycle for the LCC and CSC signals according to a particular example implementation of the present invention. In this case, the LCC signal is low for the first 25% of the duty cycle and is high for the remaining 75% of the duty cycle. The LEDs 102, in this case, would be dimmed by 25% and only be on for 75% of the time of the duty cycle. The duty cycle is typically sufficiently short (for example, 1 ms) such that turning on and off of the LEDs 102 is not perceivable by a human eye but instead appears only as an imperceptible reduction in the average light output from the LEDs 102. As shown in FIG. 3, the CSC signal is high for the first 31 of 32 duty cycle slots and is low for the final duty cycle slot. In this case, when the CSC signal is low and the LCC signal is high, the current sense voltage $V_{CS}$ is desirable to be detected.

If the values of the resistances $R_4$, $R_1$ and $R_2$ are equal to the sample values 0.25Ω, 0.025Ω and 0.025Ω respectively and the current flowing through the current sense circuit 106 is 4.0 A, then the instantaneous power loss due to the current sense circuit 106 for the slots 9 to 31 of the duty cycle of FIG. 3 when the LCC and CSC signals are high would be ~0.19 W. During the final time slot of the duty cycle of FIG. 3, the instantaneous power loss due to the current sense circuit 106 would be 4.0 W. Therefore, in this case, over the overall duty cycle, the average power loss due to the current sense circuit 106 would be equal to: ~0.26 W. In the case that the LCC signal is high for the entire duty cycle (i.e. the LEDs are on 100% of the duty cycle), the average power loss due to the current sense circuit 106 would be equal to: ~0.31 W (but would be a lower percentage of total power than the previous ~0.26 W case, even though the raw number is higher). In the sample case in which the duty cycle is divided into 256 slots, the CSC signal is low for only one slot and the LCC signal is high for 100% of the 256 slots, the average power loss due to the current sense circuit would be equal to: ~0.20 W. In all of these examples, the average power loss due to the current sense circuit 106 is substantially below the power loss that would result with the use of only the current sense resistor 108.

Although depicted with two current sense control transistors $110_1, 110_2$, it should be understood that there could be only one current sense control transistor or more than two. The number of current sense transistors used depends upon the desired adjustment in resistance within the current sense circuit 106. If only a single current sense control transistor is used, the resistance $R_{CS}$ across the current sense circuit 106 when the CSC signal is high will be higher than the case in which two or more similar transistors are used. Using additional current sense transistors will further reduce the resistance $R_{CS}$ across the current sense circuit 106 when the CSC signal is high, therefore reducing the power loss due to the current sense circuit 106 during this time.

Although a plurality of LEDs 102 is depicted in FIG. 1, it should be understood that the number of LEDs should not limit the scope of the present invention. In particular, the circuit of FIG. 1 could be implemented with one or more LEDs. Further, a plurality of circuits similar to that of FIG. 1 could be implemented within one or more light engine circuits. For instance, each circuit could include a different set of LEDs that are independently controlled by the same or separate LCC signals. This is particularly useful in cases in which the LEDs in each circuit have different aspects, such as color or color temperature. By independently controlling LCC signals for circuits comprising different color/color temperature LEDs, the color/color temperature of the light output from a lighting apparatus can be controlled. The current sense circuit 106 could be implemented within only one of the circuits, a plurality of the circuits or all of the circuits. Further, in some embodiments, the current sense circuit 106 could be shared if two or more of the LED circuits were coupled together at node N1. In this case, the LCC signals of the two or more LED circuits could be activated at different times within the duty cycle and the current sense circuit 106 could be activated (by having the CSC signal turn low) during a time when each of the LED circuits were activated.

Although the current sense circuit 106 of FIG. 1 is coupled between the reference ground and the current control transistor 104, it should be understood that the circuit could be implemented in other variations. For instance, the constant current circuit 106 could be implemented in series between the supply voltage $V_{DD}$ and the LEDs 102. In this case, the current sense transistors $110_1, 110_2$ could be implemented as p-channel transistors, rather than the n-channel transistors depicted in the embodiment of FIG. 1. The calculation of the current using such a design would be slightly more complicated as the voltage drop across the current sense circuit would be equal to the supply voltage $V_{DD}$ minus the voltage at the node between the current sense circuit and the LEDs 102. An apparatus that is to calculate the current flowing through the current sense circuit would therefore need to have knowledge of the current supply voltage $V_{DD}$ in order to accurately calculate the current.

Figure 2A:
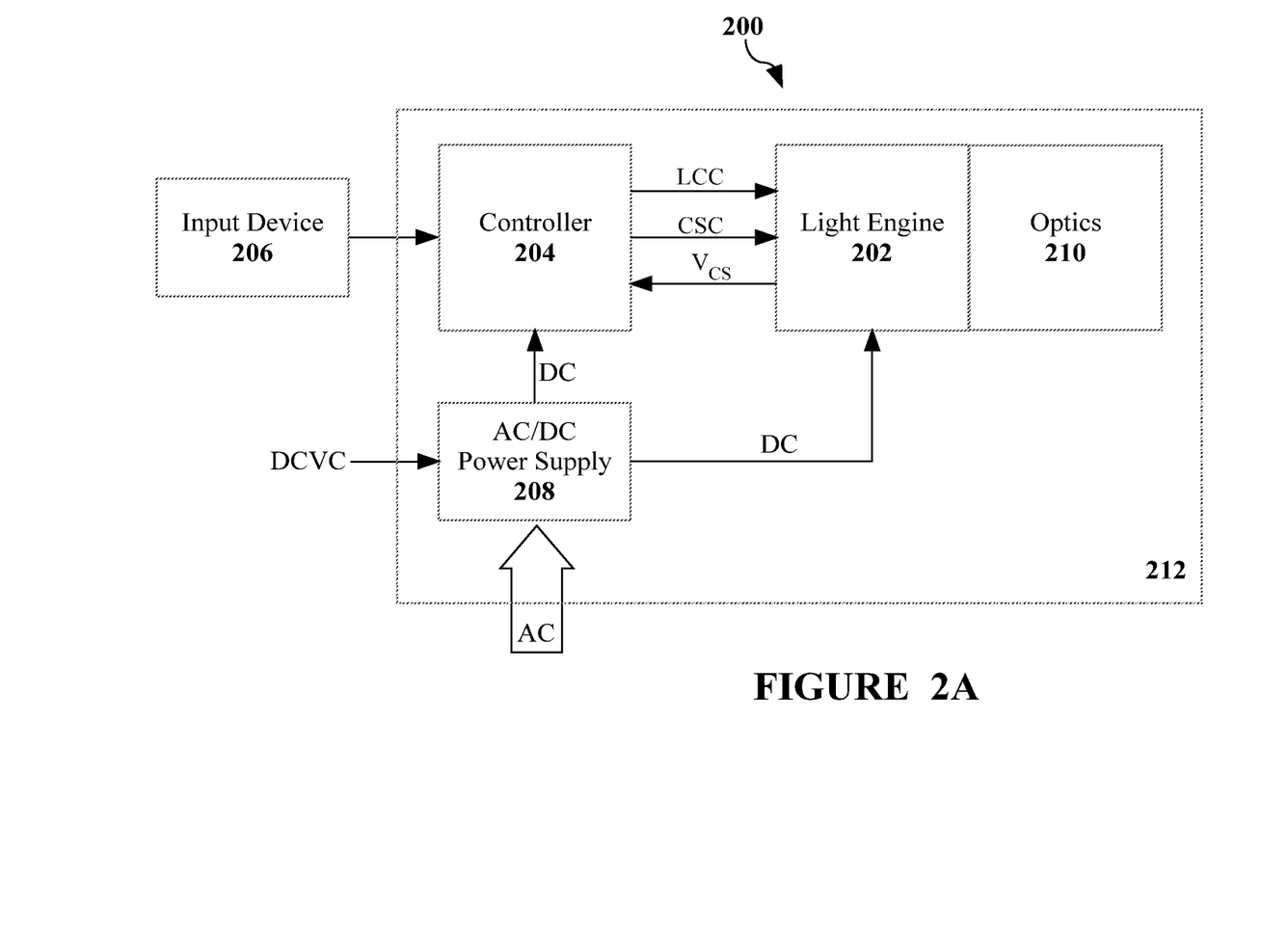
FIGS. 2A, 2B and 2C are logical block diagrams of an LED lighting apparatus according to first, second and third embodiments of the present invention respectively.
Figure 2B:
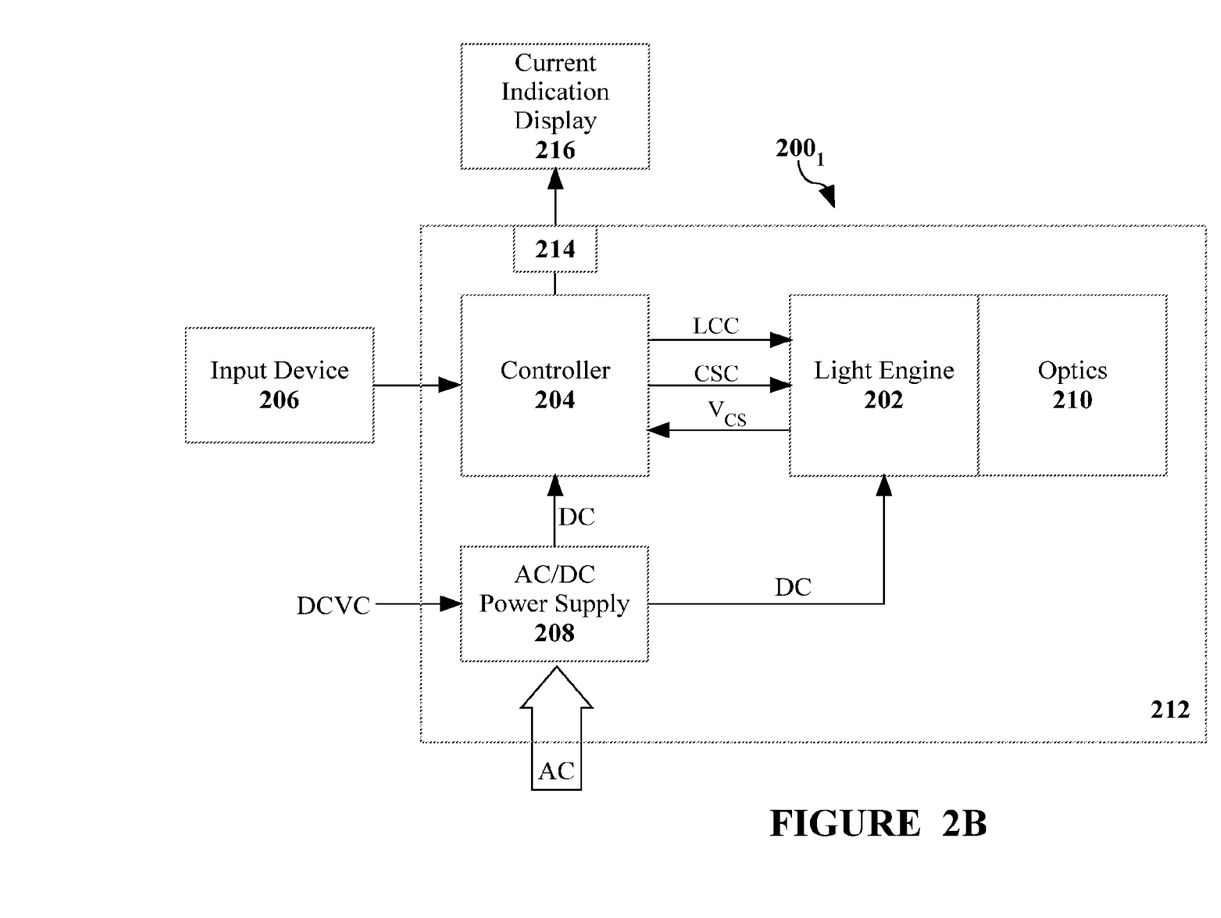
Figure 2C:
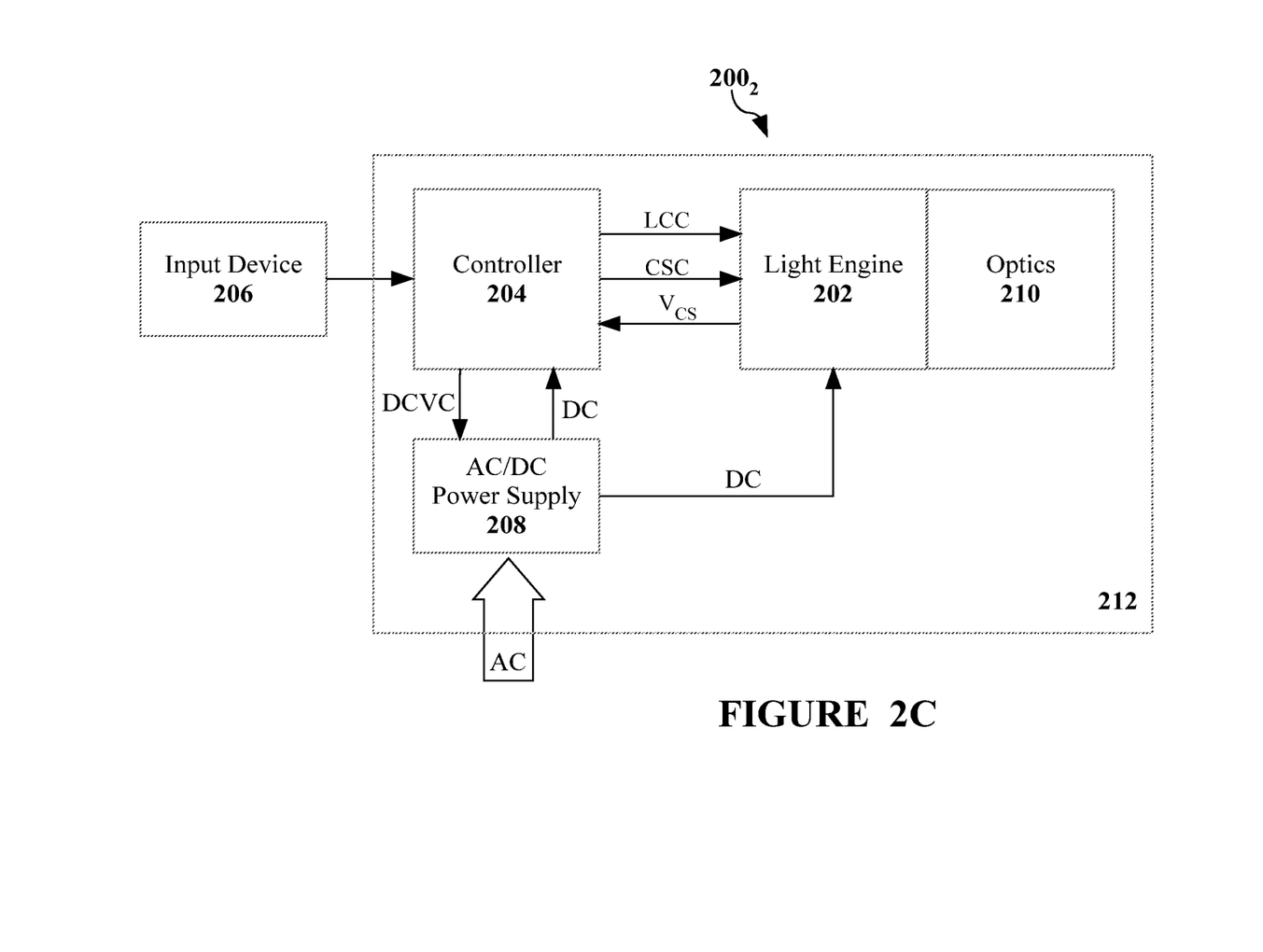

FIGS. 2A, 2B and 2C are logical block diagrams of LED lighting apparatus according to first, second and third embodiments of the present invention respectively. As depicted in FIG. 2A, the LED lighting apparatus 200 comprises a number of distinct components that together enable the lighting apparatus 200 to output light. The LED lighting apparatus 200 comprises a light engine 202 which comprises a circuit with LEDs that emit light when activated, the light engine 202 in some embodiments comprising the circuit of FIG. 1; a controller 204 that outputs control signals (the LCC and CSC signals) to the light engine 202 and detects the current sense voltage $V_{CS}$ on the light engine 202; an input device 206 used by a user of the lighting apparatus 200 to select aspects of the light output such as the intensity, color and/or color temperature; and an AC/DC power supply 208 that receives AC power from the power grid (not shown) and provides DC power to the controller 204 and the light engine 202. As shown in FIG. 2A, the lighting apparatus 200 further comprises an optics element 210 that diffuses the light output from the LEDs. A thermal element (not shown) would also be included within the lighting apparatus 200 to remove heat generated by the LEDs in order to enable them to operate at an acceptable temperature. In this particular embodiment, the lighting apparatus 200 further comprises an encasement 212 that provides protective structure and artistic design to the lighting apparatus 200. In this case, the encasement 212 encases the light engine 202, the controller 204, the AC/DC power supply 208 and the optics element 210.

The light engine 202 according to some embodiments of the present invention is similar to the circuit described herein with reference to FIG. 1. It should be understood that although depicted as a single component in FIG. 2A, the light engine 202 may comprise a plurality of components. For example, the LEDs may be physically separated from non-LED elements. Further, all or some of the elements within the light engine 202 may be integrated within another component such as the controller 204, the encasement 212 or optics element 210.

The controller 204 in FIG. 2A manages the activation of the LEDs within the light engine 202 using the LCC signal (which may comprise one or more signals to one or more circuits within the light engine 202) and, therefore, controls the output light spectrum that is generated by the lighting apparatus 200. In the architecture depicted in FIG. 2A, the controller 204 receives a constant voltage rail and a reference ground from the AC/DC power supply 208 and receives user input signals from the input device 206. The controller 204 interprets the user input signals and may rely on information stored within a local memory (not shown) and internal software or firmware to generate the LCC signal(s) for the light engine 202. Each of the LCC signals, according to some embodiments of the present invention, comprises a pulse signal that may be in an active high state for a set time within a duty cycle.

As one skilled in the art would understand, the controller 204 can take a number of different forms including a microcontroller programmed with software, firmware, an ASIC, an FPGA, a microprocessor, logical hardware components or other components that can generate digital signals. In one particular embodiment, the controller comprises a microprocessor from Microchip Technologies Inc. of Chandler, Ariz., USA.

The input device 206 may comprise a dimmer (ex. a triac dimmer, a 0-10V Lutron dimmer), an infrared remote control, a computer or any other device that can allow a user to make selections concerning aspects of the lighting apparatus 200. The aspects selected may comprise any one or more of the intensity, the color, the color temperature, tint, etc. In some cases, the input device 206 may comprise sensor devices such as an ambient light sensor, a motion sensor and/or an occupancy sensor. In these cases, the sensors may provide input signals to the controller 204 that affect the LCC signal(s) that the controller 204 transmits to the light engine 202. In some embodiments, the input device 206 may be integrated with another component such as the controller 204 or the encasement 212. In other cases, the lighting apparatus 200 may not have an input device 206. For instance, in one embodiment, variations in the aspects of the light output may be controlled by the controller 204 without external inputs using pre-programmed code. The pre-programmed code could be enabled based on an internal clock, a vibration detection sensor, an internal ambient light sensor, an internal motion sensor, an internal occupancy sensor, or another component that may trigger a change in an aspect of the lighting apparatus 200. Further, the pre-programmed code could be set at the factory to calibrate the color temperature/color of the lighting apparatus 200. Yet further, the lighting apparatus 200 in some embodiments comprises an intensity or color sense component and the pre-programmed code can correct for variations in the intensity, color temperature or color, for example variations may occur over time as LEDs may decrease in intensity at different rates over long time periods on the of months or years of operation.

The AC/DC power supply 208 may comprise a large number of different power supply configurations depending upon the particular application. For instance, the AC/DC power supply 208 should be selected to match the power needs of the light engine 202 and the controller 204 and particularly to the LEDs within the light engine 202 which will utilize the majority of the power. The AC/DC power supply 208 of FIG. 2A receives a DC Voltage Control (DCVC) signal that can be used to adjust the DC voltage level applied to the light engine 202 and the controller 204. This adjustment in the DC voltage level may be necessary due to uncertainties with the forward voltages of the LEDs within the light engine 202. In one example, a 24V/20 W power supply may be used in a light engine configuration that activates 7 LEDs in series at a time, each LED having a forward voltage drop of approximately 3.4V in this example. To ensure that a desired current flows through the LEDs within the light engine 202 despite uncertainties within the forward voltage drops of the LEDs, adjustments in the DC voltage level can be made using the DCVC signal as will be described in detail below.

One skilled in the art will understand that the optics element 210 and the thermal element (not shown) can be implemented in many different manners depending on the specific technical requirements of the lighting apparatus 200. The optics element 210, according to some embodiments of the present invention, diffuse the light output from the LEDs such that a single color of light is perceivable at an output of the lighting apparatus 200. In one specific example, the optics element 210 comprises a frosted acrylic plate. The thermal element (not shown) may comprise a heat sink, a heat conductive plate or film, heat conductive fins, one or more heat pipes, a fan, a heat removal diaphragm or other elements that can enable flow of heat away from the LEDs.

It should be understood that the lighting apparatus 200 of FIG. 2A is only a sample lighting architecture that could be used with the present invention and should not be used to limit the scope of the present invention. Large numbers of alternative lighting architectures are understood by one skilled in the art. For instance, the controller 204 could be integrated with any one or more of the light engine 202, the input device 206 and the AC/DC power supply 208. Further, in some lighting architectures, one or more of the components within the lighting apparatus 200 may be removed. For instance, in some lighting architectures the thermal element (not shown) may be removed as passive cooling could be sufficient to remove heat generated by the LEDs or the encasement 212 could act as a thermal element itself.

According to embodiments of the present invention, the controller 204 of FIG. 2A controls the CSC signal that in turn controls the current sense control transistors $110_1, 110_2$ of FIG. 1. By selecting a time (for example, one or more time slots within a duty cycle) to trigger the CSC signal low and therefore turn off the current sense control transistors $110_1$, $110_2$, the controller 204 can decide when to measure the current sense voltage $V_{CS}$. In some embodiments of the present invention, the controller 204 comprises an ADC that is operable to convert the current sense voltage $V_{CS}$ from an analog signal to a digital form. In other embodiments, the ADC is a separate component coupled to the controller 204.

Figure 5A:
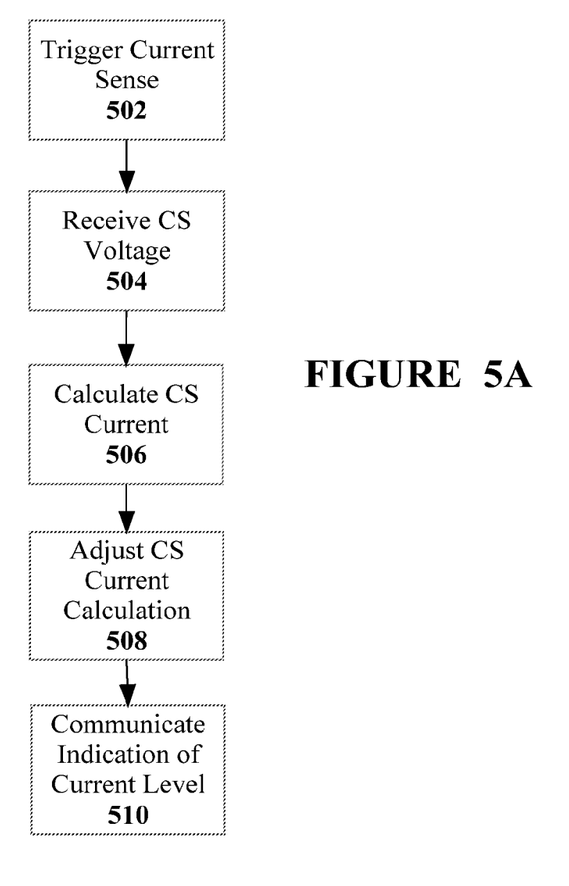
FIGS. 5A and 5B are flow charts illustrating steps of a control algorithm performed by a controller within the LED lighting apparatus of one of FIGS. 2A, 2B and 2C according to two embodiments of the present invention.

FIG. 5A is a flow chart illustrating steps of a control algorithm performed by the controller 204 within the LED lighting apparatus 200 of FIG. 2A according to an embodiment of the present invention. Firstly, as described above, the controller 204 triggers a current sense operation at step 502. A current sense operation can be said to be activated when the controller 204 sets the CSC signal to a low state for a time period (ex. one time slot in a duty cycle) while the LCC signal for the circuit is activated. As discussed, in this state, the resistance $R_{CS}$ across the current sense circuit 106 of FIG. 1 is increased to the resistance of the current sense resistor 108 and the current sense voltage $V_{CS}$ is increased as a result.

The controller 204 subsequently, at step 504, receives the current sense voltage $V_{CS}$. This could be in digital form from an ADC that has converted the analog voltage to a digital form or could be in analog form and the controller 204 performs the conversion. Next, at step 506, the controller 204 calculates the current flowing through the current sense circuit 106 at the time that the current sense voltage $V_{CS}$ was measured. At this time, the resistance $R_{CS}$ across the current sense circuit 106 was equal to the resistance $R_A$ of the current sense resistor 108. By dividing the current sense voltage $V_{CS}$ by the known value of the resistance $R_A$, the controller 204 can calculate the current flowing the current sense circuit 106. This calculated current will correspond to the current flowing through the LEDs 102 during the current sense operation, but may not exactly indicate the current flowing through the LEDs during a normal operation in which the current sense transistors $110_1, 110_2$ are turned on and the resistance $R_{CS}$ across the current sense circuit 106 is significantly reduced. At step 508, the controller 204 may adjust the current calculated at step 506 to compensate for the change in resistance $R_{CS}$ across the current sense circuit 106 during normal operation relative to during current sense operation. In some embodiments, step 508 is not performed and the use of the current calculated at step 506 is utilized by the controller 204.

Next, at step 510, according to some embodiments of the present invention, the controller 204 communicates an indication of the current level calculated in one of steps 506 and 508. This communication can take place in a number of manners and, as will be described herein with reference to FIG. 2A, will be directed to a user that can adjust the DCVC signal that controls the DC voltage level applied to the light engine 202. In the embodiment of FIG. 2A, the controller 204 communicates an indication of the current level to a user through adjustments in the light output from the lighting apparatus 200.

In one particular implementation, the controller 204 determines whether the current level calculated is within an acceptable range of values for the current flowing through the LEDs within the light engine 202. If the current level calculated is not within the acceptable range of values, the controller 204 may control the LCC signal to go to a low state for all or substantially all of the time within a duty cycle and therefore effectively turn off the light output from the light engine 202. By doing this, a user can detect this information and interpret it as an indication of the current level. In response, the user can adjust the DCVC signal to correct the DC voltage level output from the AC/DC power supply 208. For instance, the controller 204 may only turn off the light output from the light engine 202 if the current level calculated is above a maximum acceptable level. By doing this, the controller 204 can protect the LEDs within the light engine 202 from excess current issues. The controller 204 can continually check the current level within the light engine 202 even after turning the light output off by selectively turning the LCC signal to a high state and the CSC signal to a low state for a short time period (for example one time slot out of 256 time slots) in each duty cycle or a plurality of duty cycles (ex. one time slot every second). In this example, once the user has adjusted the DCVC signal so that the DC voltage level applied as the supply voltage $V_{DD}$ is lowered to the point where the current level calculated by the controller 204 is below the maximum acceptable level, the controller 204 can control the LCC signal(s) as normal and allow a normal operation for the light output from the lighting apparatus 200 to continue.

In a second implementation, the controller 204 can communicate an indication of the current level in a different manner. For instance, in some embodiments, the controller 204 may control the LCC signal(s) in order to create a visible blinking in the light output from the lighting apparatus 200. The actual value of the current level calculated or an indication of the current level as it relates to an acceptable range of values, can be communicated using a series of flashes that may be of consistent length or alternatively be of different time length (ex. a set of short and long flashes that communicate information using a protocol such as Morse Code). In another variant, the controller 204 may cause the light output from the lighting apparatus to blink if the current level calculated is outside of the acceptable range for the light engine, the length of the blinks indicating to a user the difference between the current level calculated and the acceptable range of currents. For example, as the user adjusts the DCVC signal to move the DC voltage level applied to the light engine 202 towards the correct level, the blinks may decrease in length to indicate that the current level calculated is getting closer to the acceptable range. It should be understood that other techniques to communicate an indication of the current level calculated are possible using adjustments in the light output from the lighting apparatus 200.

In yet another implementation, the controller 204 can communicate an indication of the current level using changes in the light output from the lighting apparatus 200 that are not visible to the human eye. In order to accomplish this, the controller 204 may utilize a number of different modulation techniques including pulse position modulation, frequency modulation or pulse width modulation to generate the LCC signal(s) that in turn control the light output of the lighting apparatus 200. For example, the controller 204 may transmit digital information related to the current level calculated by adjusting the duty cycle utilized or by slightly adjusting the on/off time of the LEDs from duty cycle to duty cycle. The light output from the lighting apparatus 200 can then subsequently be received and interpreted by a separate apparatus as will be described with reference to FIGS. 4A and 4B.

Figure 4A:
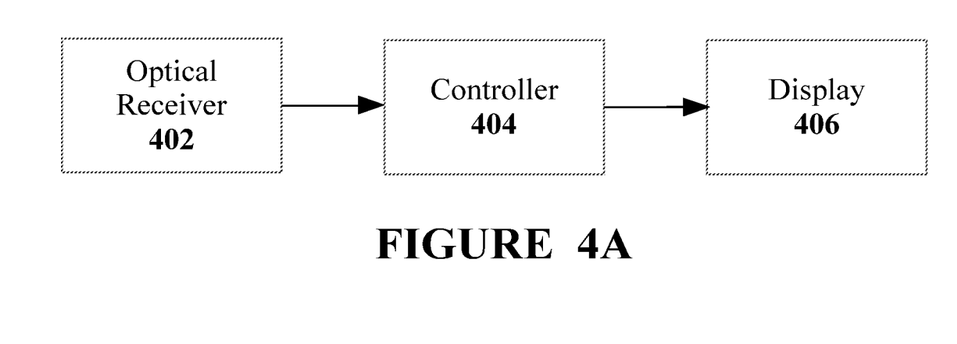
FIGS. 4A and 4B are logical block diagrams of a current level display apparatus according to particular example implementations of the present invention in which the LED lighting apparatus of FIG. 2A communicates information optically.

FIGS. 4A and 4B are logical block diagrams of a current level display apparatus according to particular example implementations of the present invention in which the LED lighting apparatus of FIG. 2A communicates information optically. The current level display apparatus of FIG. 4A comprises an optical receiver 402, a controller 404 and a display 406. The optical receiver 402 receives the light output from the lighting apparatus 200 and provides an indication of the light levels to the controller 404 which can then interpret the light levels in order to extract the information related to the indication of the current level. The interpretation techniques used will depend upon the modulation techniques used within the controller 204. It should be understood that the optical receiver 402 and the controller 404 work together to regenerate the indication of the current level being transmitted by the controller 204 through the light output of the lighting apparatus 200. Once the indication of the current level has been regenerated, the controller 404 transmits it to the display 406 so that it can be displayed to a user. The user can read the display 406 and based upon the indication of the current level (which may be a number or another indication (ex. color, shape, arrow, etc.), the user can adjust the DCVC signal within the AC/DC power supply 208 in order to adjust the DC supply voltage $V_{DD}$ applied to the light engine 202.

Figure 4B:
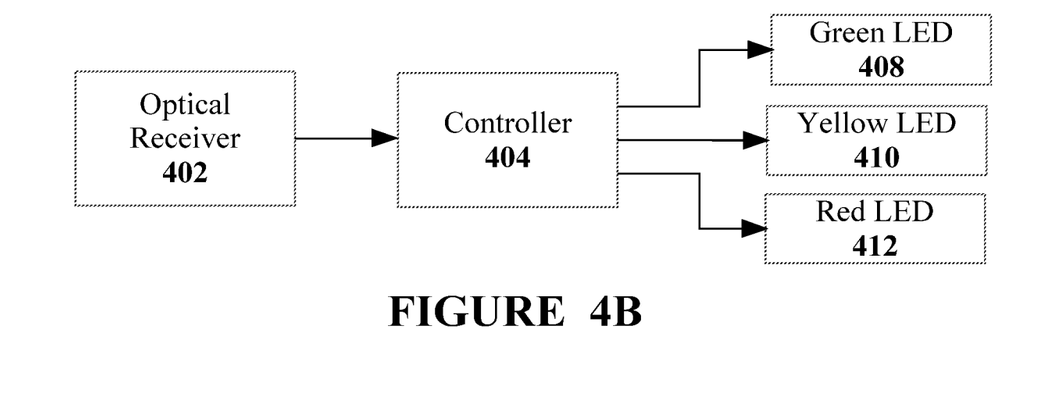

FIG. 4B depicts a slightly modified version of the current level display apparatus of FIG. 4A. In the FIG. 4B, the display 406 is replaced with first, second and third sets of LEDs 408,410,412. In one implementation, the first, second and third sets of LEDs 408,410,412 comprise green LEDs, yellow LEDs and red LEDs respectively. In this embodiment, the controller 404 is operable to turn on one or more of the sets of LEDs 408,410,412 based upon the received indication of the current level. For example, if the current level is within an acceptable range, the green LEDs 408 may be turned on while, if the current level is in at a critical level, the red LEDs 412 may be turned on. In other cases, in which the current level is not ideal, the yellow LEDs 410 may be turned on. The LEDs 408,410,412 may be used to provide information and/or instructions to a user in order to trigger an adjustment in the DCVC signal for the AC/DC power supply 208.

It should be noted that the adjustment of the DCVC signal could be accomplished in a number of manners depending upon the particular implementation within the AC/DC power supply 208. In some example implementations, an adjustment in the DCVC signal is triggered by a mechanical adjustment in an element such as a screw, dial, dimmer or other input device. In other implementations, the DCVC signal may be controlled electronically. In embodiments of the present invention related to FIG. 2A, a human will view the indication of the current level in some form as described and manually adjust the voltage of the AC/DC power supply 208, though it should be understood that in other embodiments, such a voltage adjustment is done automatically.

FIG. 2B is a modified logical block diagram to that depicted in FIG. 2A. The lighting apparatus 200₁ of FIG. 2B is similar to that of FIG. 2A and therefore similar elements have been labeled with the same references. In FIG. 2B, the lighting apparatus 200₁ further comprises a terminal 214 which is coupled to a current indication display 216. In this embodiment, rather than communicate an indication of the current level through control of the LCC signal(s) and therefore the light output of the lighting apparatus, the controller 204 communicates an indication of the current level calculated to the current indication display 216 directly through the terminal 214. This communication could take many forms and the indication of the current level may be transmitted in analog or digital form, may be modulated or not and may be encapsulated within a protocol system (ex. packet based protocol such as Internet Protocol). The current indication display 216 can operate in much the same manner as either the apparatus of FIG. 4A or 4B but there will be no need for the optical receiver 402.

FIG. 2C is a further modified logical block diagram to that depicted in FIG. 2A. The lighting apparatus 200₂ of FIG. 2C is similar to that of FIG. 2A and therefore similar elements have been labeled with the same references. In FIG. 2C, the controller 204 does not communicate the indication of the current level to a user so that the user can adjust the DC voltage level output from the AC/DC power supply 208. Instead, in FIG. 2C, the controller 204 directly controls the AC/DC power supply 208 using the DCVC signal. In this embodiment, the controller 204 will operate with a modified control algorithm to that described with reference to FIG. 5A for the lighting apparatus 200 of FIG. 2A.

Figure 5B:
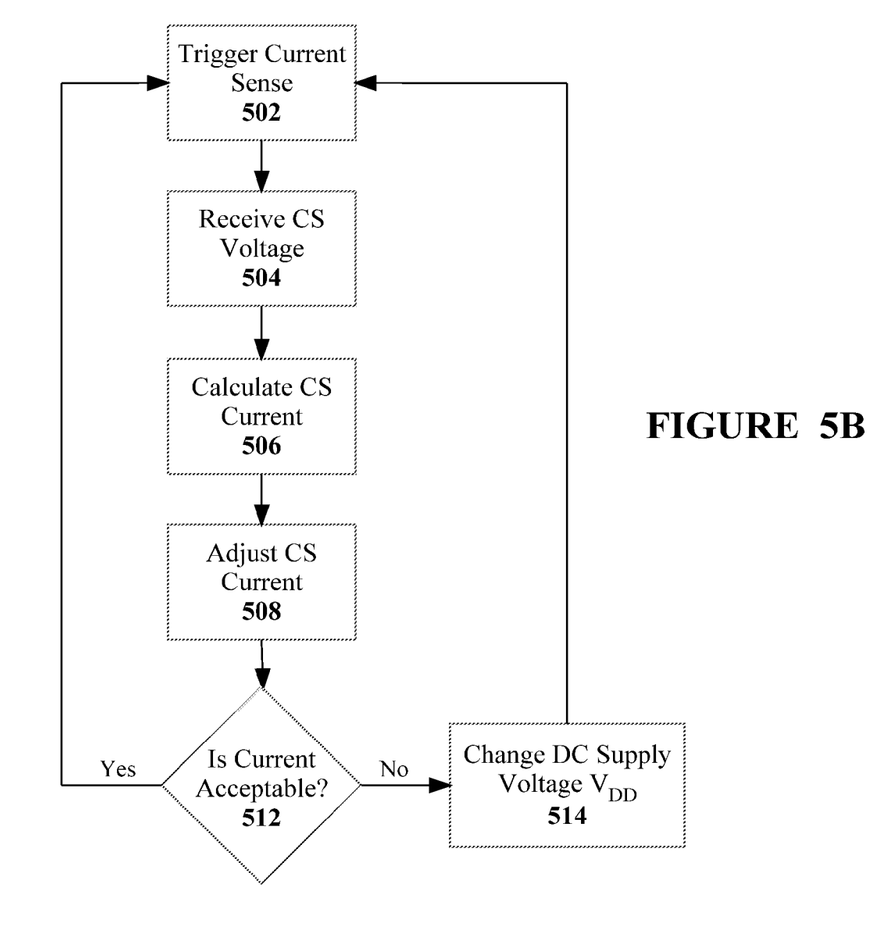

FIG. 5B is a flow chart illustrating steps of a control algorithm performed by a controller within the LED lighting apparatus 200₂ of FIG. 2C according to an embodiment of the present invention. The control algorithm of FIG. 5B is similar to that of FIG. 5A and therefore similar elements have been labeled with the same references. As depicted in FIG. 5B, rather than step 510, the controller 204 within the lighting apparatus 200₂ determines at step 512 whether the current level calculated within step 508 (or 506 if step 508 is not performed) is acceptable. This can be done by a number of manners. For example, an acceptable range may be programmed within the controller 204 and the controller 204 may compare the current level calculated with the acceptable range. In other examples, the controller 204 may have an exact value that is desired for the current level within the light engine and the controller 204 may only determine that the current level calculated is acceptable if the current is precisely at the value desired.

As shown, if the current level calculated is not acceptable at step 512, the controller 204 adjusts the DC supply voltage $V_{DD}$ output from the AC/DC power supply 208 by adjusting the DCVC signal. This adjustment may be precisely calculated to result in a current level within the light engine 202 that will be acceptable or alternatively may be an adjustment in the direction towards the current level becoming acceptable. In particular, the controller 204 may determine the level of the adjustment by the difference between the current level calculated and the acceptable range of current levels (or the exact value that is desired). After the adjustment at step 514, the controller 204 may continue to monitor the current level by returning to step 502 and repeating the steps of FIG. 5B. If the current level calculated is acceptable at step 512, the controller 204 may also continue to monitor the current level by returning to step 502 and repeating the steps of FIG. 5B. Alternatively, once the current level calculated is acceptable at step 512, the controller 204 may stop monitoring the current level for a set time period or possibly forever.

Although the embodiments of FIGS. 2A, 2B and 2C are described as independent embodiments of the present invention, it should be understood that two or more of the embodiments could be implemented within a single lighting apparatus. For instance, the automatic control system described above with reference to FIG. 2C could be implemented along with a communication system such as that described with reference to FIG. 2A or 2B. The use of the communication system of an indication of the current level may be desirable to provide back-up information, to provide a person the actual value for the current level and/or to provide an emergency shut-off of the LEDs in the case that the current flowing through the LEDs is above a maximum acceptable level.

Although described as time slots within a duty cycle, it should be understood that the divisions within a duty cycle may be in any segments. For instance, in some embodiments of the present invention, the duty cycle is divided into time segments in μseconds. In other embodiments, the duty cycle is divided into time slots (ex. 256) but the actual number of time slots assigned to a particular operational state may not be an integer. In these cases, the exact selection of the number of time slots may be set by an average of the number of time slots across a plurality of duty cycles.

Although various embodiments of the present invention have been described and illustrated, it will be apparent to those skilled in the art that numerous modifications and variations can be made without departing from the scope of the invention, which is defined in the appended claims.

What is claimed is:

1. A circuit comprising:
    at least one light emitting diode (LED) coupled between a supply voltage and a node;
    a current sense circuit coupled between the node and a reference ground, the current sense circuit comprising a resistor coupled in parallel with at least one transistor, the at least one transistor being activated during a first state and being deactivated during a second state;
    wherein the node is coupled to a current determination apparatus operable to determine a current flowing through the at least one LED during the second state using a voltage sensed at the node.

2. A circuit according to claim 1 further comprising a light control transistor coupled in series with the at least one LED, the light control transistor being activated for a time period set for the at least one LED to be activated within a duty cycle; and wherein the at least one transistor within the current sense circuit is within the second state during the time period set for the at least one LED to be activated within the duty cycle.

3. A circuit according to claim 1, wherein a resistance of the current sense circuit is at a first value during the first state and a second value higher than the first value during the second state.

4. A circuit according to claim 1, wherein the at least one transistor within the current sense circuit is within the first state for a first time period within a duty cycle and within the second state for a second time period within the duty cycle, the first time period being substantially longer than the second time period.

5. An apparatus incorporating a circuit according to claim 1 and further comprising the current determination apparatus.

6. An apparatus according to claim 5, wherein, in order to determine a current flowing through the at least one LED during the second state, the current determination apparatus is operable to sense a voltage at the node during the second state and to divide the sensed voltage by a resistance of the resistor within the current sense circuit.

7. An apparatus according to claim 6, wherein the current determination apparatus is further operable to determine a current flowing through the at least one LED during the first state by compensating the determined current flowing through the at least one component during the second state by the change in resistance within the current sense circuit between the first and second states.

8. An apparatus according to claim 5, wherein the current determination apparatus is further operable to control the at least one transistor within the current sense circuit.

9. An apparatus according to claim 8 further comprising a light control transistor coupled in series with the at least one LED, the light control transistor being activated for a time period set for the at least one LED to be activated within a duty cycle; and wherein the at least one transistor within the current sense circuit is within the second state during the time period set for the at least one LED to be activated within the duty cycle.

10. An apparatus according to claim 9, wherein the current determination apparatus is further operable to control the light control transistor.

11. A circuit comprising:
    at least one light emitting diode (LED) coupled between a node and a reference ground;
    a current sense circuit coupled between a supply voltage and the node, the current sense circuit comprising a resistor coupled in parallel with at least one transistor, the at least one transistor being activated during a first state and being deactivated during a second state;
    wherein a voltage at the node is coupled to a current determination apparatus operable to determine a current flowing through the at least one LED during the second state.

12. A circuit according to claim 11 further comprising a light control transistor coupled in series with the at least one LED, the light control transistor being activated for a time period set for the at least one LED to be activated within a duty cycle; and wherein the at least one transistor within the current sense circuit is within the second state during the time period set for the at least one LED to be activated within the duty cycle.

13. A circuit according to claim 11, wherein a resistance of the current sense circuit is at a first value during the first state and a second value higher than the first value during the second state.

14. A circuit according to claim 11, wherein the at least one transistor within the current sense circuit is within the first state for a first time period within a duty cycle and within the second state for a second time period within the duty cycle, the first time period being substantially longer than the second time period.

15. An apparatus incorporating a circuit according to claim 11 and further comprising the current determination apparatus.

16. An apparatus according to claim 15, wherein, in order to determine a current flowing through the at least one LED during the second state, the current determination apparatus is operable to sense a voltage at the node during the second state to calculate a voltage drop across the current sense circuit by subtracting the sensed voltage from the supply voltage and to divide the voltage drop by a resistance of the resistor within the current sense circuit.

17. An apparatus according to claim 16, wherein the current determination apparatus is further operable to determine a current flowing through the at least one LED during the first state by compensating the determined current flowing through the at least one component during the second state by the change in resistance within the current sense circuit between the first and second states.

18. An apparatus according to claim 11, wherein the current determination apparatus is further operable to control the at least one transistor within the current sense circuit.

* * * * *